United States Patent
Hsu

[19]

[11] Patent Number: 5,495,202
[45] Date of Patent: Feb. 27, 1996

[54] HIGH SPECTRAL PURITY DIGITAL WAVEFORM SYNTHESIZER

[75] Inventor: Steve I. Hsu, Rancho Palos Verdes, Calif.

[73] Assignee: Hughes Aircraft Company, Los Angeles, Calif.

[21] Appl. No.: 89,066

[22] Filed: Jun. 30, 1993

[51] Int. Cl.$^6$ .............................. H03B 19/00; H03L 7/00; G06G 7/28
[52] U.S. Cl. ........................... 327/113; 364/607; 364/851
[58] Field of Search ............................ 307/271; 328/14, 328/60; 364/607, 608, 851, 852

[56] References Cited

U.S. PATENT DOCUMENTS

| | | | |
|---|---|---|---|
| 4,458,329 | 7/1984 | Remy | 328/14 |
| 4,659,999 | 4/1987 | Motoyama | 331/38 |
| 4,675,724 | 6/1987 | Wagner | 358/19 |
| 5,128,623 | 7/1992 | Gilmore | 328/14 |
| 5,184,093 | 2/1993 | Itoh | 328/14 |

Primary Examiner—William L. Sikes
Assistant Examiner—Tiep H. Nguyen
Attorney, Agent, or Firm—Leonard A. Alkov; W. K. Denson-Low

[57] ABSTRACT

A digital waveform synthesizer, using a direct digital synthesizer and a digital frequency divider. The direct digital synthesizer provides a digitally synthesized input frequency signal. An upconverter and frequency divider circuit upconverts and divides the synthesized input frequency signal to provide an divided synthesized frequency signal. An output upconverter circuit is coupled to the upconverter and divider circuit for providing an upconverted output frequency signal. A reference frequency generator is coupled to the direct digital synthesizer, to the upconverter and divider circuit, and to the output upconverter, for providing clock and frequency reference signals thereto. The waveform generator is coupled to the direct digital synthesizer for commanding a desired waveform. The frequency divider is used to improve the inherently poor spurious signal performance of the direct digital synthesizer. The digital waveform synthesizer provides fast switching, flexible and precisely defined frequency output signals. The digital waveform synthesizer may be used with any signal generator that requires high spectral purity and frequency precision, but requires relatively narrow signal bandwidth.

5 Claims, 4 Drawing Sheets

HIGH SPECTRAL PURITY DIGITAL WAVEFORM SYNTHESIZER

BACKGROUND

The present invention relates generally to waveform synthesizers, and more particularly, to a digital waveform synthesizer that employs a direct digital synthesizer and digital frequency dividers.

An existing variable frequency oscillator (VFO) uses a combination of indirect frequency synthesis (phase lock loop frequency synthesizer) to provide frequency upconversion and multiplication, and a direct digital synthesizer using a triangular waveform to generate very fine frequency steps. The use of the phase lock loop synthesizer with very narrow bandwidth limits the switching speed performance of the this design. In addition, the phase lock loop scheme uses programmable feedback dividers that degrade the noise (and spurious signal) performance inside the phase lock loop bandwidth by a factor of $20*\log(N)$, where N is the divider ratio, over the noise floor of both the frequency divider and the direct digital synthesizer. The phase lock loop also adds a noise hump near its loop bandwidth. Finally, the triangular waveform used in the direct digital synthesizer generates a higher spur level compared to commercially available direct digital synthesizers that generate a sinusoidal waveform.

The linear frequency modulated (FM) waveform for use in frequency modulated ranging (FMR) is generated by applying a linear voltage ramp derived from a linear voltage ramp generator to a voltage controlled crystal oscillator (VCXO). The output of the VCXO is frequency multiplied to X-band to provide maximum usable linear FM bandwidth of 100 KHz. The linearity and the slope accuracy is limited by the linearity of the VCXO and the accuracy of the voltage ramp generator. The slope accuracy is increased but at a cost of using multi-unit level calibration and a microwave calibration target source. Also, the VCXO requires approximately 1 KHz of linear frequency tuning which may be achieved by degrading its FM noise performance.

Accordingly, it is an objective of the present invention to provide a direct digital synthesizer that overcomes the limitations of the above-described conventional waveform synthesizers. In particular, it is an objective of the present invention to provide a direct digital synthesizer that provides fast switching, flexible and precisely defined signals, and that improves the inherently poor spurious signal performance of its direct digital synthesizer.

SUMMARY OF THE INVENTION

There are many advantages in using a direct digital synthesizer in a frequency synthesizer, but a primary disadvantage thereof is that it has inherently high spurious signal levels. To overcome this problem, the present invention provides for the addition of one or multiple frequency dividers in the synthesizer. One drawback of this approach is that the signal bandwidth of the direct digital synthesizer is reduced by the frequency division factor. However, the present invention is ideally suited for a waveform generator that requires very high spectral purity but relatively narrow signal bandwidth.

Thus, in order to meet the above and other objectives, the present invention is a digital waveform synthesizer that comprises a direct digital synthesizer, a waveform generator, a reference frequency generator, and an upconverter and digital frequency divider circuit. The direct digital synthesizer provides a digitally synthesized input frequency signal. The digitally synthesized input frequency signal may be a waveform derived from a waveform generator coupled to the direct digital synthesizer. More specifically, the waveform generator may comprise a frequency accumulator adapted to receive frequency modulated ramp slope signals, and a control and timing circuit coupled to the frequency accumulator and direct digital synthesizer for synthesizing a linear frequency modulated waveform.

A first upconverter and divider circuit comprises a mixer having a first input coupled to the direct digital synthesizer for receiving the synthesized input frequency signal, and having a second input coupled to the reference signal generator for receiving a first predetermined reference frequency signal. A bandpass filter is coupled to the mixer, a divide by N divider circuit is coupled to the bandpass filter, where N is the divide number, and a low pass filter is coupled to the divide by N divider circuit to complete the first upconverter and divider circuit. The first upconverter and divider circuit produces a first output signal comprising a first upconverted and divided signal. An output upconverter circuit is coupled to the first upconverter and divider circuit and comprises a mixer and a bandpass filter. The mixer is coupled to the low pass filter on one input and has a second input coupled to the reference signal generator for receiving a second predetermined reference frequency signal. The output upconverter circuit upconverts the first upconverted and divided signal (first output signal) derived from the digitally synthesized input frequency signal.

The digital waveform synthesizer may further comprise additional upconverter and divider circuits coupled between the first upconverter and divider circuit and the output upconverter circuit. Each additional upconverter and divider circuits are coupled to the reference frequency generator for receiving additional predetermined frequency reference signals therefrom.

The digital waveform synthesizer is adapted to generate a linear frequency modulated (FM) waveform on a transmitter drive signal and a receiver first local oscillator (LO) signal, and a variable frequency oscillator (VFO) signal at a receiver I/Q reference frequency or at a LO frequency. The frequency divider is used to improve the inherently poor spurious signal performance of the direct digital synthesizer. The direct digital synthesizer provides fast switching, flexible and precisely defined frequency output signals. The digital waveform synthesizer may also be used with any signal generator that requires high spectral purity and frequency precision, but requires relatively narrow signal bandwidth.

The digital waveform synthesizer also provides significant performance improvements over existing variable frequency oscillator and frequency modulated ramp circuit designs. The digital waveform synthesizer also requires less hardware to implement the VFO and FMR functions. For the variable frequency oscillator application, the digital waveform synthesizer provides substantial improvements in switching speed, spurious signal level, and frequency modulated (FM) noise levels over the current design described above in the Background section. For the frequency modulated ramp application, the digital waveform synthesizer eliminates FMR linearity and slope errors of the existing design. In addition, the digital waveform synthesizer provides unlimited and flexible FMR slope generation, and eliminates the need for an elaborate calibration routine and its associated hardware. Furthermore, the digital waveform synthesizer eliminates FMR requirements from the low noise voltage controlled crystal oscillator (VCXO), thereby making extremely low noise crystal oscillator possible, which helps reduce noise.

Additional advantages of the present digital waveform synthesizer include generation of calibration signals, stretch waveform, and other modulation types. The digital waveform synthesizer may be employed with radar systems and missiles with improved radar performance and reduction in cost.

Two applications of the present digital waveform synthesizer in a high performance airborne radar are as a variable frequency oscillator (VFO) and as a frequency modulated ranging (FMR) waveform generator. The variable frequency oscillator (VFO) is used to compensate for Doppler frequency shift in the returned radar signals. Its tuning range is approximately +250 KHz to −100 KHz for X-band radar.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
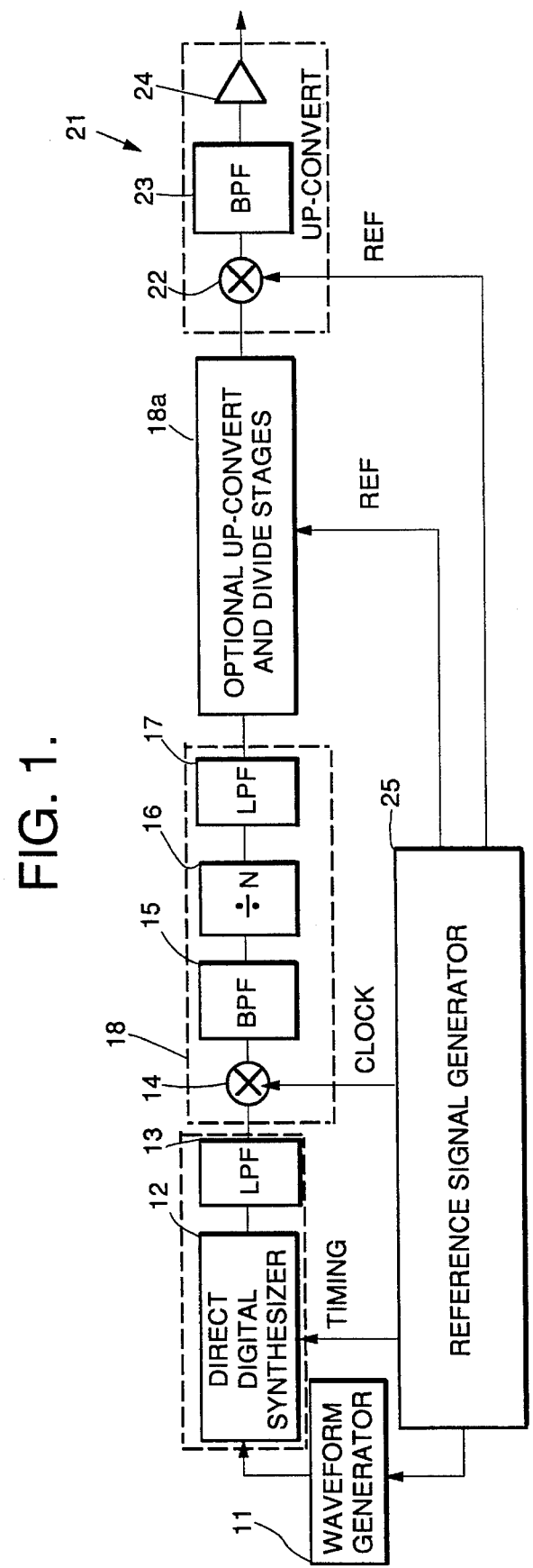
FIG. 1 shows a block diagram of a generic digital waveform synthesizer in accordance with the principles of the present invention.

Referring to the drawing figures, FIG. 1 illustrates a generic digital waveform synthesizer 10 in accordance with the principles of the present invention. The digital waveform synthesizer 10 is comprised of a waveform generator 11 whose output is coupled through a direct digital synthesizer 12 and a low pass filter 13 to a first upconverter and divider circuit 18. The first upconverter and divider circuit 18 is comprised of a mixer 14 that has one input coupled to the output of the low pass filter 13. The output of the mixer 14 is coupled by way of a bandpass filter (BPF) 15 through a divide by N divider circuit 16 to a second low pass filter 17. Additional optional upconverter and divider circuits 18a may be serially coupled to the output of the first upconverter and divider circuit 18 for a particular application. An output upconverter circuit 21 is coupled to the output of the first or optional upconverter and divider circuits 18, 18a, as the case may be. The output upconverter circuit 21 is comprised of a mixer 22, a second bandpass filter 23 and an amplifier 24. A reference signal generator 25 has outputs respectively coupled to the waveform generator 11, the direct digital synthesizer 12, an input of the mixer 14 of each of the upconverter and divider circuits 18, 18a that are used, and the output upconverter circuit 21.

The primary element of the digital waveform synthesizer 10 is the direct digital synthesizer 12. The function of the direct digital synthesizer 12 is to generate a precisely defined signal for the digital waveform synthesizer 10. The main parameters of the direct digital synthesizer 12 are spurious signal level and its clock frequency. The spurious signals generated by the direct digital synthesizer 12 are a function of the number of bits that are used and the linearity of D/A converters employed therein. The clock frequency determines the maximum output frequency of the direct digital synthesizer 12 (approximately 45% of the clock frequency) which in turn determines the maximum useful operating bandwidth thereof.

The greater the bandwidth of the direct digital synthesizer 12, the higher the divider ratio that may be used for a given bandwidth requirement for the digital waveform synthesizer 10. Therefore, the direct digital synthesizer 12 is designed to operate over its entire usable operating bandwidth. However, the direct digital synthesizer 12 may be operated at a narrow bandwidth to avoid frequency regions containing large spurious signals. The divider circuit 16 improves the spurious signal level by at least a factor of 20*log(N), where N is the divide ratio. Therefore, an ideal direct digital synthesizer 12 has a high clock frequency and low spurious signals.

Since different direct digital synthesizers 12 may operate at different clock frequencies with different spur levels, a relative measurement of quality of the direct digital synthesizer 12 may be roughly defined by multiplication of the spur level and the square of the maximum clock frequency. Using the above factor as a reference, the best commercially available direct digital synthesizer 12 is capable of −65 to −70 dBc worst case spurs at a clock frequency of 60 MHz. This is presently provided by a Stanford Telecom 1 X7X series synthesizer, such as a model STEL-1277 direct digital synthesizer. The performance capabilities of the STEL-1277 direct digital synthesizer employed in the present digital waveform synthesizer 10 is sufficient to significantly improve FMR and VFO circuit performance.

The waveform generator 11 provides digital commands to the direct digital synthesizer 12. It may provide a linearly changing frequency command as in the case of an FMR signal, or a simple frequency command to generate a CW signal in the case of a VFO signal. Other types of commands may include phase and amplitude modulation signals.

The first upconverter and divider circuit 18 is used to increase the frequency output of the direct digital synthesizer 12. This is done for several reasons. First, since the divider circuit 16 lowers the frequency, upconverting the frequency prior to the divider circuit 16 keeps the frequency output of the divider circuit 16 high. A higher frequency speeds up settling of transients introduced into the direct digital synthesizer 12, and most applications require a frequency higher than is normally provided by the direct digital synthesizer 12 alone. This has an additional advantage that, any spurs introduced by the mixer 14 (mixer intermodulation products) are also lowered by the divider circuit 16. This is not the case if upconversion is done at the output of the divider circuit 16. The mixer type, frequencies, and drive levels are chosen so that the mixer intermodulation product does not dominate the spurious signal performance.

The reference signal generator 25 provides a reference frequency signal for upconversion of the signal provided by the direct digital synthesizer 12. For most applications, the reference signal may be a single frequency, but multiple frequencies may be used to increase the effective bandwidth of the digital waveform synthesizer 10. The frequency, or frequencies, generated by the reference signal generator 25 depends on the application, but should not be high enough that the bandpass filter 15 cannot reject low order mixer intermodulation products. Also the spurious and FM noise of the reference frequency signal should be low enough not to degrade the spur and noise performance. The reference signal generator 25 is also used to generate a clock signal for the direct digital synthesizer 12 and a timing signal for the waveform generator 11.

The bandpass filter 15 is provided to filter out unwanted mixer intermodulation products, and further filter out spurs outside the operating bandwidth. Any intermodulation products or spurs inside the bandwidth are not attenuated. Also the passband of the bandpass filter 15 may require good phase linearity to minimize modulation distortion.

The divider circuit 16 is used to improve the spurious signal levels. The typical spurs from the direct digital synthesizer 12 are single sideband spurs. The divider circuit 16 attenuates these spurs by a factor of [20*log(N)+6] dB. The FM spurs (such as due to mixer intermodulation products) are attenuated by 20*log (N) and AM spurs are theoretically reduced to zero. An added advantage of the divider circuit 16 is that it also reduces noise by the same factor. With a relatively high divide ratio, FM noise performance of the digital waveform synthesizer 12 is excellent, and it is set by the noise floor of the divider circuit 16. One by-product of using the divider circuit 16 is that the bandwidth of the direct digital synthesizer 12 is reduced by the same divide ratio. Therefore, the by providing a large divider ratio for the direct digital synthesizer 12 results in a very narrow operating bandwidth, unless its bandwidth is extended by means of multiple reference signals and upconverter and divider circuits 18a as mentioned previously.

The optional upconverter and divider circuits 18a may be added to increase the total divide ratio. The output upconverter circuit 21 is used to generate the desired operating frequency range of the direct digital synthesizer 12.

Figure 2:
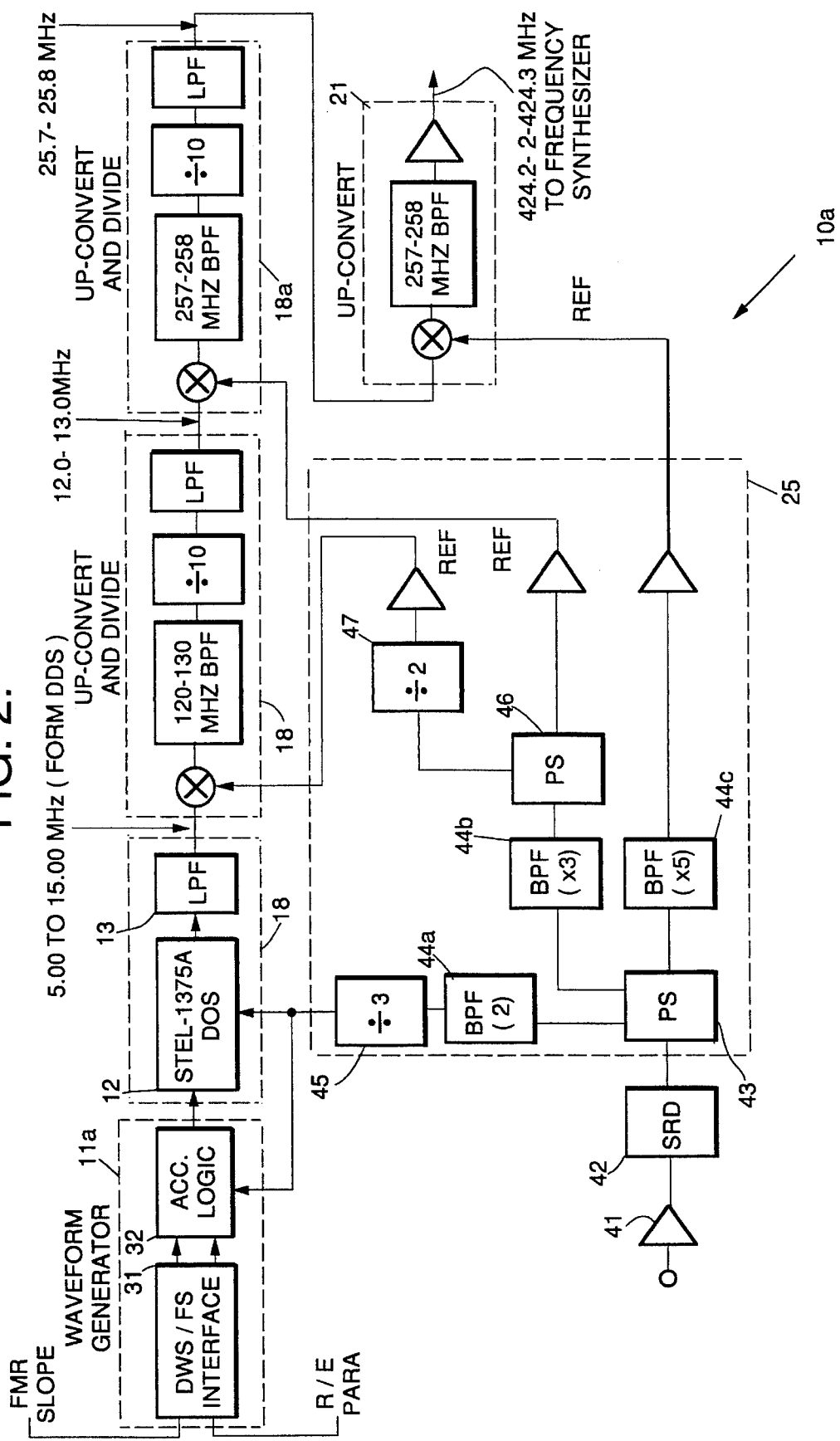
FIG. 2 shows a detailed block diagram of a digital waveform synthesizer that is used to generate frequency modulated ranging (FMR) waveform.

FIG. 2 shows a detailed block diagram of a digital waveform synthesizer 10a that is used to generate linear FM for frequency modulated ranging (FMR) applications. This synthesizer 10a is substantially similar to the generic synthesizer 10 described with reference to FIG. 1, and includes a single optional upconverter and divider circuit 18a. The specifics of each of the digital waveform synthesizer 10a are shown in the drawing figure, including details of the reference signal generator 25 and the waveform generator 11a. A more detailed diagram of the waveform generator 11a is provided in FIG. 3 and will be described below. The waveform generator 11a includes an interface circuit 31 that is coupled to an accumulator circuit 32. The interface circuit 31 is adapted to receive FMR slope commands and timing parameter signals from an external source (not shown), such as a radar data processor, for example. The reference signal generator 25 receives a frequency reference input signal, in this case 90.00 MHz. The reference signal generator 25 is comprised of a buffer amplifier 41 coupled through a step recovery diode (SRD) frequency multiplier 42 to a power splitter (PS) 43. The power splitter 43 couples the multiplied input signal by way of a bandpass filter 44a to a divide-by-three divider 45 whose output is coupled to the accumulator logic 32 and to the direct digital synthesizer 12. An output of the power splitter 43 is coupled through a bandpass filter 44b to a second power splitter 46 that splits the signal and applies it through a divide- by-two divider 47 to the mixer in the upconverter and divider circuit 18 and by way of another output to the mixer of the second upconverter and divider circuit 18a. Another output of the power splitter 43 is coupled through a bandpass filter 44c to the mixer of the output upconverter circuit 21. The balance of the digital waveform synthesizer 10a has been described in detail above, and its design and construction are considered routine and self-explanatory in view of the drawing figure.

Figure 3:
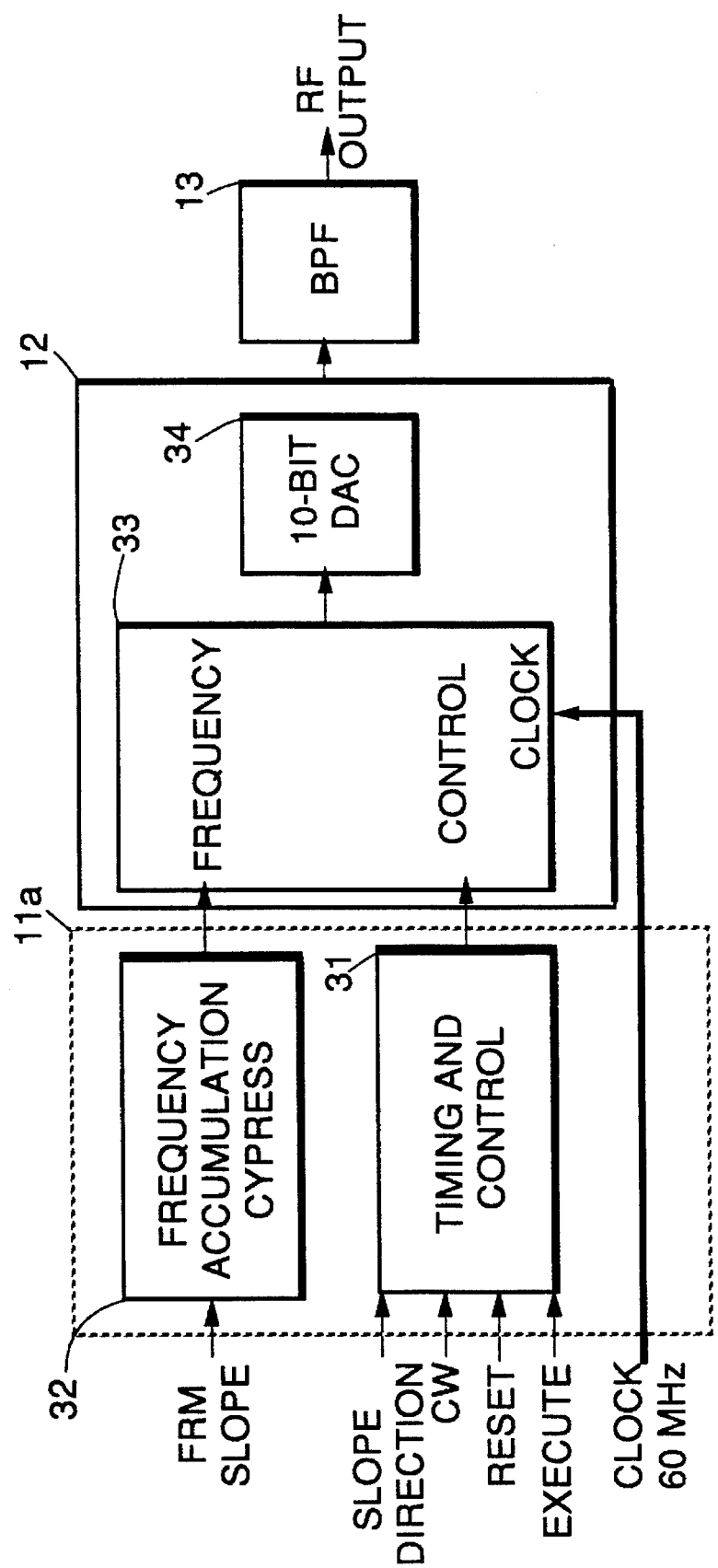
FIG. 3 shows a more detailed block diagram of the waveform generator used in the direct digital synthesizer of FIG. 2.

FIG. 3 shows a more detailed block diagram of the waveform generator 11a and direct digital synthesizer 12 used in the digital waveform synthesizer 10a of FIG. 2. The waveform generator 11a includes the interface circuit 31 that comprises a timing and control circuit 31, such as a programmable gate array model PG-64, manufactured by Xilinx, for example, and the frequency accumulator 32, such as a model CY7C510 accumulator, manufactured by Cypress, for example. FMR slope input signals derived from the external source are applied to the frequency accumulator 32 while various timing and command signals derived from the external source are applied to the timing and control circuit 31. The direct digital synthesizer 12 of FIG. 3 is an integrated circuit that incorporates a model STEL-1175 numerically controlled oscillator (NCO) 33 coupled to a 10-bit digital-to-analog converter (DAC) 34. Frequency signals and control signals are coupled from the waveform generator 11a to the numerically controlled oscillator (NCO) 33 in a conventional manner. The interconnection and operation of these circuits are generally well understood by those skilled in the art and may be constructed using application notes available from the manufacturers and general of circuit design principles.

The operation of the digital waveform synthesizer 10a will now be described. The digital waveform synthesizer 10a is used to generate a linear frequency modulated signal for use in the frequency modulated ranging for airborne radar applications. The interfacing circuit 31 receives frequency ramp slope and timing signals from the external source, such as the radar data processor, for example. The accumulator circuit 32 is loaded with a desired slope value, and given proper timing commands, it updates the frequency information provided to the direct digital synthesizer 12a. The direct digital synthesizer 12 is clocked at 60 MHz but the frequency is updated at ¼ of the clock rate due to internal limitations. For a typical FMR waveform, the direct digital synthesizer 12 sweeps linearly from 5 MHz to 15 MHz in 10 Msec to provide a frequency ramp slope of 1 GHz per second. The total bandwidth from the direct digital synthesizer 12 is 10 MHz. The waveform is repeated many times for a typical FMR waveform. The output of the direct digital synthesizer 12 is coupled to the low pass filter 13 to filter the principle DDS spurious signals. The remaining worst case spurious signal level is approximately −70 dBc. The output of the low pass filter 13 is coupled to the upconversion and divider circuits 18, 18a to improve spurious signal levels. The theoretical spur improvement is better than −45 dB which brings the spur level below −110 dBc at the output. At the same time, the output bandwidth is reduced from 10 MHz to 100 KHz. The output upconversion circuit 21 using proper reference signals from the reference generator 25, converts the final output frequency provided by the digital waveform synthesizer 10a to a specified level.

A summary of the performance of the digital waveform synthesizer 10a shown in FIG. 2 that provides for FMR signals is shown in Table 1.

TABLE 1

| | |
|---|---|
| FMR bandwidth | 100 KHz |
| Spurious | less than −115 dBc |
| FM noise | less than −149 dBc/Hz (10 KHz out from carrier) |
| Phase linearity | less than 0.1% |

Figure 4:
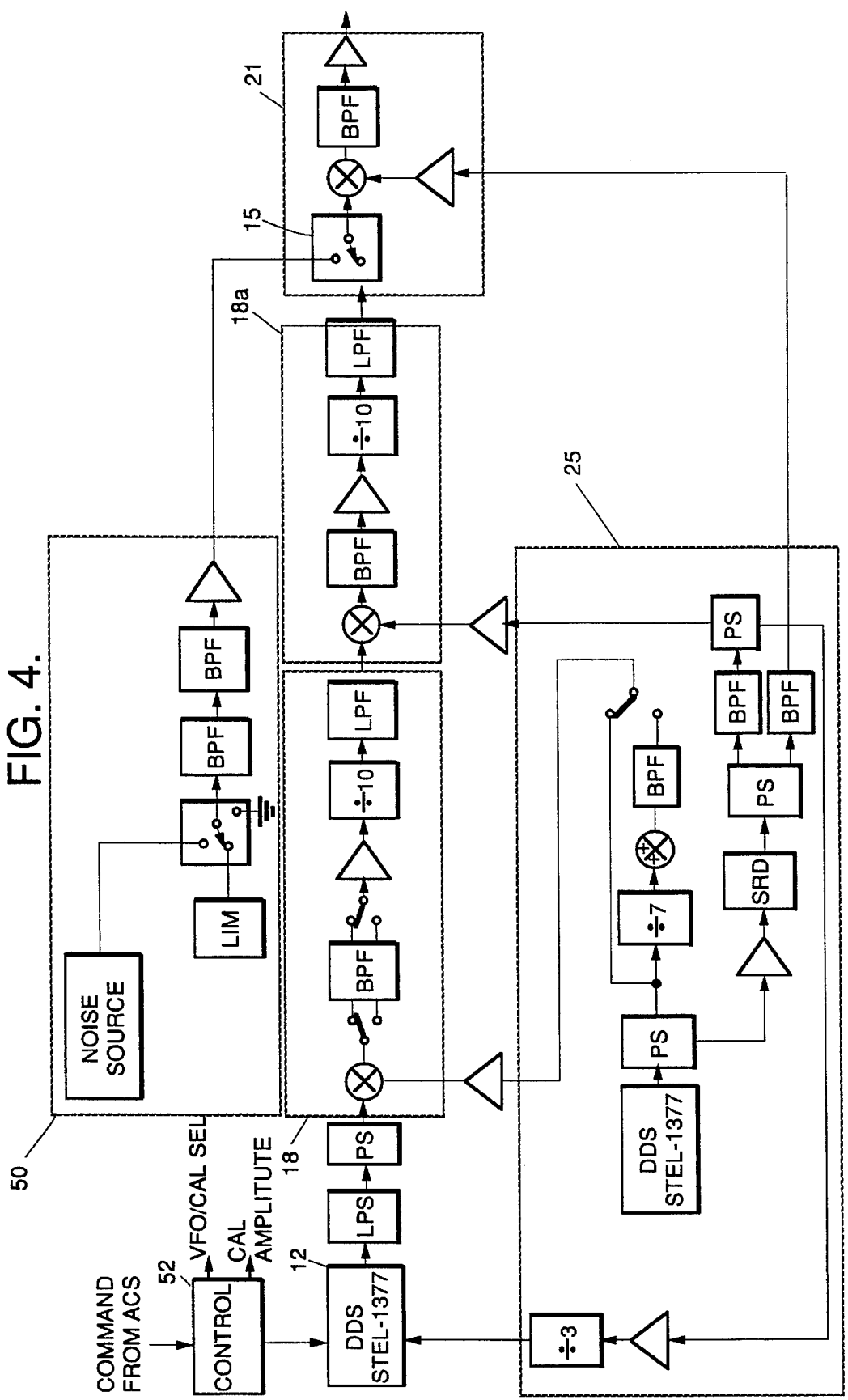
FIG. 4 shows a block diagram of a digital waveform synthesizer comprising a variable frequency oscillator and calibration signal generator.

FIG. 4 shows a block diagram of a dual function digital waveform synthesizer 10b comprising a variable frequency (VCO) generator 40 that provides for variable frequency operation, and a calibration signal generator 50. The digital waveform synthesizer 10b is substantially similar to the circuit shown in FIG. 2, but does not include the waveform generator 11. However, the digital waveform synthesizer 10b additionally includes a calibration signal generator 50, a switch 51 for switching between the calibration signal generator 50 and the VCO generator 40. In addition, a control circuit 52 is coupled to the direct digital synthesizer 12 the processes commands received from the external source (the radar data processor, for example) to control operation thereof depending upon which generator 40, 50 (VFO or calibration signal) is used. Since the calibration signal and VFO signal are not used simultaneously, a single direct digital synthesizer 12 is used to generate both signals under control of the control circuit 52. The interconnection and operation of these circuits shown in FIG. 4 are generally well understood by those skilled in the art, and may be constructed using application notes available from the manufacturers and general of circuit design principles. Consequently, and in view of the previous description, a detailed discussion of the construction of the digital waveform synthesizer 10b of FIG. 4 will not be provided.

The operation of the digital waveform synthesizer 10b will now be described. The digital waveform synthesizer 10b is used to generate a finely tunable signal for VFO applications and calibration signals for a radar receiver phase and amplitude calibration procedure. In both applications, the digital waveform synthesizer 10b generates a continuous wave (CW) signal commanded by the radar data processor. The control circuit 52 receives frequency and mode (VFO/Calibration mode) commands from the radar data processor. The frequency information is applied to the direct digital synthesizer 12 for desired CW frequency generation, and the mode and frequency command determines the positions of the various switches. In the VFO mode, the direct digital synthesizer 12 generates a maximum signal range from 8 to 21 MHz. Two stages of upconversion and division are provided by the two upconverter and divider circuits 18, 18a to improve spurious signal level by better than 40 dB to give an output spur level of less than −105 dBc. In the first upconverter and divider circuit 18, two reference signals are used to effectively double the DDS bandwidth to 26 MHz. The total bandwidth is reduced to 300 KHz after the second divide by 8 circuit. For the calibration modes, the two upconverter and divider circuits 18, 18a are bypassed, and an optional noise source is added to give noise or CW type signals as a calibration signal. The spurious signal level for the calibration signal is the same as that of the direct digital synthesizer 12 which is adequate for calibration signal purposes. The output upconverter circuit 21 brings up the output frequencies to the desired level.

A summary of performance of the digital waveform synthesizer 10b of FIG. 4 is shown in Table 2.

TABLE 2

|  | VFO | Calibration signal |
|---|---|---|
| Bandwidth | +125/+275 KHz | ±1 MHz |
| Spurious | less than −105 dBc | less than −65 dBc |
| FM noise | less than −149 dBc/Hz (10 KHz out from carrier) | less than −105 dBc/KHz (10 KHz out from carrier) |
| Switching speed | less than 1 μsec | less than 1 μsec |

Thus there has been described a new and improved digital waveform synthesizer that employs a direct digital synthesizer and digital frequency dividers. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A digital waveform synthesizer comprising:
   a direct digital synthesizer for providing a digitally synthesized input frequency signal;
   a reference frequency generator for providing a clock signal to the direct digital synthesizer and predetermined frequency reference signals;
   an upconverter and divider circuit coupled to the direct digital synthesizer for upconverting and dividing the synthesized input frequency signal to provide a divided synthesized frequency signal, said upconverter and divider circuit comprising:
      a mixer having an input coupled to the direct digital synthesizer for receiving the synthesized input frequency signal, and having a second input coupled to the reference signal generator for receiving a first predetermined reference frequency signal;
      a bandpass filter coupled to the mixer;
      a divide by N divider circuit, where N is a divide number, coupled to the bandpass filter; and
      a low pass filter coupled to the divide by N divider circuit;
   an output upconverter circuit coupled to the upconverter and divider circuit and to the reference frequency generator for upconverting the divided synthesized frequency signal to provide a desired upconverted synthesized output frequency signal;
   a calibration signal generator coupled in parallel with the upconverter and divider circuit; and
   switching means having inputs coupled to the calibration signal generator and the upconverter and divider circuit and having an output coupled to the output upconverter circuit for switching therebetween to provide for calibration and variable frequency signal sources.

2. The digital waveform synthesizer of claim 1 which further comprises a waveform generator coupled to the direct digital synthesizer for providing digital commands thereto and for commanding a desired waveform.

3. The digital waveform synthesizer of claim 1 which further comprises at least one additional upconverter and divider circuit coupled between the upconverter and divider circuit and the output upconverter circuit, and that is coupled to the reference frequency generator for receiving at least one additional predetermined frequency reference signal therefrom to provide for additional upconversion and division of the synthesized input frequency signal.

4. The digital waveform synthesizer of claim 2 wherein the waveform generator comprises:
   a frequency accumulator adapted to receive frequency modulated ramp slope signals from an external source; and
   a control circuit coupled to the frequency accumulator and to the external source for processing input control signals derived from the external source and causing the frequency accumulator to generate linear frequency ramp commands.

5. A digital waveform synthesizer comprising:
   a direct digital synthesizer for providing a digitally synthesized input frequency signal;

a reference frequency generator for providing a clock signal to the direct digital synthesizer and predetermined frequency reference signals;

an upconverter and divider circuit coupled to the direct digital synthesizer for upconverting and dividing the synthesized input frequency signal to provide a divided synthesized frequency signal, said upconverter and divider circuit comprising:

a mixer having an input coupled to the direct digital synthesizer for receiving the synthesized input frequency signal, and having a second input coupled to the reference signal generator for receiving a first predetermined reference frequency signal;

a bandpass filter coupled to the mixer;

a divide by N divider circuit, where N is a divide number, coupled to the bandpass filter; and a low pass filter coupled to the divide by N divider circuit;

a waveform generator coupled to the direct digital synthesizer for providing digital commands thereto and for commanding a desired waveform, wherein the waveform generator comprises:

a frequency accumulator adapted to receive frequency modulated ramp slope signals from an external source, and a control circuit coupled to the frequency accumulator and to the external source for processing input control signals derived from the external source and causing the frequency accumulator to generate linear frequency ramp commands.

* * * * *